(12) United States Patent
Idei et al.

(10) Patent No.: US 7,889,584 B2
(45) Date of Patent: Feb. 15, 2011

(54) SEMICONDUCTOR MEMORY DEVICE HAVING INPUT FIRST-STAGE CIRCUIT

(75) Inventors: Yoji Idei, Tokyo (JP); Susumu Hatano, Tokyo (JP); Yoji Nishio, Tokyo (JP); Seiji Funaba, Tokyo (JP); Yutaka Uematsu, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 80 days.

(21) Appl. No.: 11/580,275

(22) Filed: Oct. 13, 2006

(65) Prior Publication Data

US 2007/0085601 A1    Apr. 19, 2007

(30) Foreign Application Priority Data

Oct. 14, 2005 (JP) .............................. 2005-300803

(51) Int. Cl.
*G11C 7/02* (2006.01)
(52) U.S. Cl. ............... 365/206; 365/189.09; 365/210.1; 327/77
(58) Field of Classification Search ............ 365/189.09, 365/206, 210.1; 327/77
See application file for complete search history.

(56) References Cited

U.S. PATENT DOCUMENTS

| | | | |
|---|---|---|---|
| 5,907,237 A | 5/1999 | Sekimoto | |
| 5,963,077 A | 10/1999 | Kim | |
| 6,064,275 A * | 5/2000 | Yamauchi | 331/57 |
| 6,236,393 B1 * | 5/2001 | Ogawa et al. | 345/211 |
| 6,340,902 B1 * | 1/2002 | Kato | 327/77 |
| 6,500,715 B2 * | 12/2002 | Matsuzaki et al. | 438/275 |
| 6,646,945 B1 * | 11/2003 | Lee et al. | 365/226 |
| 6,774,714 B2 | 8/2004 | Chida et al. | |
| 6,804,793 B2 * | 10/2004 | Josephson et al. | 713/501 |
| 7,208,972 B2 * | 4/2007 | Dreps et al. | 326/26 |
| 2002/0043669 A1 | 4/2002 | Kobayashi et al. | |
| 2005/0285698 A1 * | 12/2005 | Kim | 333/124 |
| 2006/0198175 A1 * | 9/2006 | Badawi et al. | 365/51 |

FOREIGN PATENT DOCUMENTS

| | | |
|---|---|---|
| JP | 07-007133 | 1/1995 |
| JP | 10-064263 | 3/1998 |
| JP | 10-214122 | 8/1998 |
| JP | 2002-083930 | 3/2002 |
| JP | 2002-124570 A | 4/2002 |

OTHER PUBLICATIONS

Japanese Office Action issued in Japanese Patent Application No. 2005-300803, mailed Jul. 13, 2010.

* cited by examiner

*Primary Examiner*—Hoai V Ho
(74) *Attorney, Agent, or Firm*—McDermott Will & Emery LLP

(57) ABSTRACT

A semiconductor memory device of the present invention determines a logic level of a signal based on a predetermined reference voltage. And the memory device has an input terminal to which a reference signal having the reference voltage is input, a low-pass filter connected to the input terminal for passing a component of the reference voltage of the reference signal and eliminating undesired high frequency components, and one or more input first-stage circuits to each of which an output of the low-pass filter and a signal having the logic level to be determined are connected. In the memory device, the low-pass filter has predetermined attenuation at least at a frequency of an operating clock.

15 Claims, 8 Drawing Sheets

SEMICONDUCTOR MEMORY DEVICE HAVING INPUT FIRST-STAGE CIRCUIT

BACKGROUND OF THE INVENTION

1. Field of the Invention

This invention relates to a technical field of a semiconductor memory device having a configuration in which a logic level of a signal is determined based on a reference signal input from outside and a memory module in which a plurality of the above-mentioned semiconductor memory devices are connected to form an integrated memory.

2. Description of the Related Art

Memory modules having a plurality of semiconductor memory devices connected integrally have been conventionally used widely to construct a large capacity memory system. For example, a memory module having a configuration in which a plurality of DRAM chips is mounted on a circuit board and required signals can be transmitted through common wiring between a memory controller and the DRAM chips is employed.

Generally, in the DRAM chip, a signal having a reference voltage (herein after referred to as a VREF signal) is necessary to determine a logic level of a signal input from a DQ terminal and the like. From the viewpoint of improvements in accuracy, a specification is employed in which the VREF signal is supplied from outside without being generated inside for the recent DRAM chips. Thus, the above-mentioned memory module generally has a configuration in which the VREF signal is supplied to a plurality of DRAM chips through common wiring from a VREF voltage generator or the like disposed outside the DRAM chips.

In recent years, the operation speed has been increased with the progress of DRAM standards. For example, a high-speed operating clock of 200 to 400 MHz is used in the case of DDR2 (Double Data Rate 2)-SDRAM (Synchronous DRAM). In the memory module, if high-frequency noise occurs due to the operation using the operating clock in a certain DRAM chip, the noise is transmitted to other DRAM chips through the common wiring for the VREF signal. In this case, since a frequency band of the noise is of order of 100 MHz, it is difficult to take measures such as decoupling and the like on the circuit board of the memory module.

In particular, if the noise is mixed with the VREF signal and transmitted through the common wiring, it becomes a problem that malfunction of the DRAM chip occurs. That is, since the VREF signal used to determine the logic level of a signal has a low tolerance for noise, it is feared that a slight variation in the level prevents the accurate determination of the logic level.

For example, a configuration is known as conventional measures against the noise of the conventional semiconductor chip, in which a filter composed of a resistor and a capacitor is provided at an input side of a circuit to which a signal is input (for example, JP 2002-124570). However, such a filter is provided mainly to avoid EMC problem of the semiconductor chip, and is not effective as measures against the malfunction due to the VREF signal requiring high accuracy.

BRIEF SUMMARY OF THE INVENTION

It is an object of the invention to provide a semiconductor memory device and memory module capable of reliably eliminating noise components of a reference signal caused by an operating clock and the like when a reference voltage is supplied to the semiconductor memory device by an external reference signal, and of effectively preventing malfunction due to the effect of the noise.

An aspect of the present invention is a semiconductor memory device which determines a logic level of a signal based on a predetermined reference voltage comprising: an input terminal to which a reference signal having said reference voltage is input; a low-pass filter connected to said input terminal for passing a component of said reference voltage of said reference signal and eliminating undesired high frequency components; and one or more input first-stage circuits to each of which an output of said low-pass filter and a signal having said logic level to be determined are connected, wherein said low-pass filter has a predetermined attenuation amount at least at a frequency of an operating clock.

According to an aspect of the semiconductor memory device of the invention, when a reference signal with which noise is mixed is input from outside the semiconductor memory device, high-frequency noise components are eliminated by the low-pass filter placed immediately near the input terminal. In this case, the reference voltage which is a DC component is maintained, while it is possible to reliably attenuate the noise near an operating clock frequency which particularly has a significant effect. Then, in the input first-stage circuits, the logic level of a signal can be determined based on the reference voltage without noise, and it is thus possible to effectively prevent malfunction due to noise.

In the present invention, said low-pass filter may have various characteristics. For example, a low-pass filter having an attenuation amount greater than approximately 6 dB at a frequency of 100 MHz can be used. And, for example, a low-pass filter having characteristics of first-order attenuation can be used.

In the present invention, said low-pass filter may be a passive low-pass filter including one or more passive devices. In this case, said passive low-pass filter may include one or more resistors and one or more capacitors. Further, said capacitors may be a plurality of capacitors which is distributed and arranged in a vicinity of each of said input first-stage circuits.

In the present invention, said low-pass filter may be an active low-pass filter including one or more active devices. In this case, said active low-pass filter may include a regulator circuit having a differential configuration using a plurality of MOS transistors. Further, said regulator circuit may have a mirror capacitance connected between a gate and a drain of an output-side MOS transistor.

In the present invention, said reference voltage may be VREF defined in a standard for DDR-SDRAM. In this case, signals having said logic level to be determined may be n DQ signals input through n DQ terminals and n said input first-stage circuits may be provided.

An aspect of the present invention is a memory module on which a plurality of DRAM chips each having a configuration of said semiconductor memory device of any of claims 1 to 10 are mounted, and in the memory module, at least one input terminal to which VREF signal operating as said reference voltage is input is provided.

Meanwhile, an aspect of the present invention is a memory module on which a plurality of DRAM chips each having a configuration of said semiconductor memory device of any of claims 1 to 10 are mounted, wherein a VREF voltage generator for generating VREF signal operating as said reference voltage is provided.

As described above, according to the present invention, the low-pass filter is inserted between the input terminal for the reference signal having the reference voltage and the input first-stage circuits for various signals, so that unnecessary high-frequency components are eliminated. Therefore, it is possible to reliably eliminate high-frequency noise components mixed with the reference signal due to the operating clock and the like. By this means, it is possible to determine the logic level of a signal based on the high-accurate reference signal without noise, and malfunction can be prevented effectively in the input first-stage circuits.

In the present invention, when employing a passive low-pass filter, it is possible to obtain a sufficient amount of attenuation using a simple configuration. Meanwhile, when employing an active low-pass filter, as well as blocking noise from outside to the inside of the semiconductor memory device, it is possible to block noise from the semiconductor memory device to outside. Further, when applying the present invention to a memory module, even in a configuration in which a plurality of DRAM chips shares the reference voltage, it is possible to suppress mutual influences of noise between the chips.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Embodiments of the invention will be described below with reference to accompanying drawings. Herein, two embodiments are shown as semiconductor memory devices to which the invention is applied, and will be described respectively. Each of the embodiments described below is applied to a semiconductor memory device (DRAM) which meets standards of DDR-SDRAM, for example.

First Embodiment

Figure 1:
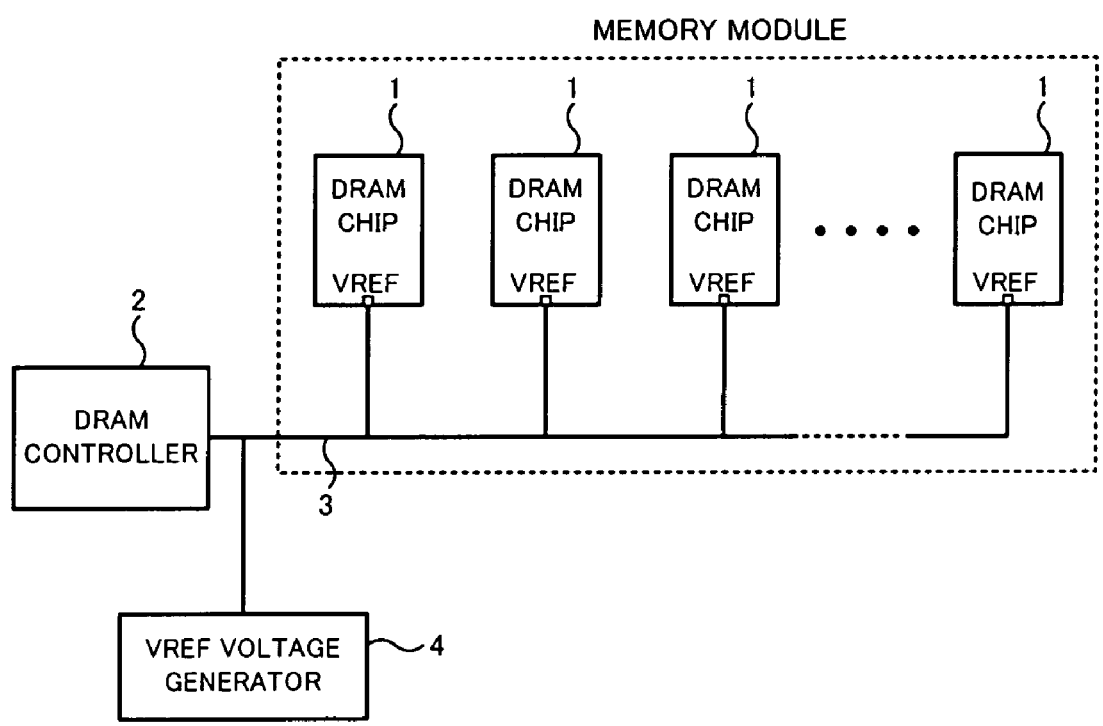
FIG. 1 is a diagram showing an entire configuration including a memory module, a DRAM controller and DRAM chips of a first embodiment.
Figure 2:
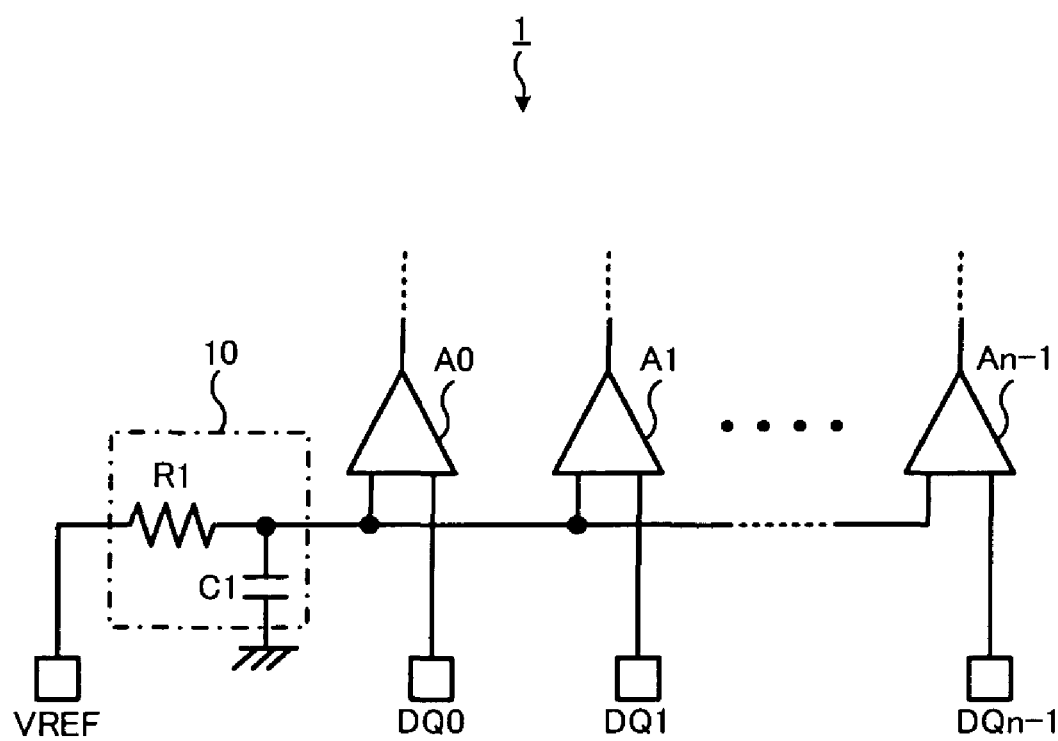
FIG. 2 is a diagram showing a principal configuration of a semiconductor memory device (DRAM chip) included in the memory module of the first embodiment.

In the first embodiment, the invention is applied to a memory module in which a plurality of semiconductor memory devices is integrally connected. FIG. 1 is a diagram showing an entire configuration including the memory module of the first embodiment. FIG. 2 is a diagram showing a principal configuration of the semiconductor memory device (DRAM chip 1) included in the memory module of the first embodiment. As shown in FIG. 1, the memory module of the first embodiment has a configuration in which a plurality of DRAM chips 1 is mounted as semiconductor memory devices and a DRAM controller 2 controls operation of each of the DRAM chips 1. Generally, the entire memory module as shown in FIG. 1 is mounted on a single circuit board.

The DRAM controller 2 supplies a number of control signals (not shown) to respective DRAM chips 1. A VREF voltage generator 4 generates a VREF signal (reference signal) used as a reference voltage to supply to each DRAM chip 1 and the DRAM controller 2. The VREF signal generally provides the reference voltage to determine a logic level of an input signal to the DRAM chip 1, and has a DC voltage approximately half of the power supply voltage VDD. In the first embodiment, since each DRAM chip 1 is configured to use the VREF signal input from outside, the VREF signal output from the VREF voltage generator 4 is supplied to a VREF terminal (see FIG. 2) of each DRAM chip 1 through common wiring 3.

As described above, the common wiring 3 is connected to all the plurality of DRAM chips 1, and therefore has a possibility of being a transmission path of noise. When coupling noise, for example, is mixed with the VREF signal in a certain DRAM chip 1, the noise is transmitted to other DRAM chips 1 through the common wiring 3 and malfunction may be caused by the effect of the noise. If the noise transmitted through the common wiring 3 has a relatively low frequency, measures can be taken such as decoupling or the like on the circuit board on which the memory module is mounted. However, on the circuit board itself, it is difficult to take measures against the noise with high frequencies of several hundreds MHz. Thus, in the first embodiment, the malfunction caused by the effect of the noise is prevented by a later described devised circuit configuration of each DRAM chip 1.

As shown in FIG. 2, the DRAM chip 1 included in the memory module of FIG. 1 has a single VREF terminal and n DQ terminals. The VREF terminal is an input terminal to which the VREF signal is input through the common wiring 3. Meanwhile, DQ0 to DQn−1 signals are input to the n DQ terminals (expressed as DQ0 to DQn−1) successively from outside. The DQ0 to DQn−1 signals are input from outside to write data of n bits to the DRAM chip 1. Further, the DRAM chip 1 has n input first-stage circuits A0 to An−1 connected to the DQ0 to DQn−1 terminals.

A low-pass filter 10 composed of a resistor R1 and a capacitor C1 is inserted between the VREF terminal and the input first-stage circuits A0 to An−1. The low-pass filter 10 has a function of passing a DC component of the VREF signal input from outside through the VREF terminal and eliminating unnecessary high-frequency components. As shown in FIG. 2, the low-pass filter 10 is composed of the resistor R1 connected in series with a signal line and the capacitor C1 connected between the signal line and ground, and has attenuation characteristics dependent on a resistance value of the resistor R1 (hereinafter simply referred to as a resistance R1) and a capacitance value of the capacitor C1 (hereinafter simply referred to as a capacitance C1). The attenuation characteristics of the low-pass filter 10 will be described in detail later.

Each of the input first-stage circuits A0 to An−1 includes circuitry such as, for example, a comparator, and to which a corresponding signal of the DQ0 to DQn−1 signals from the DQ0 to DQn−1 terminals and the VREF signal output from the low-pass filter 10 (hereinafter, referred to as an internal VREF signal) are input. In the input first-stage circuits A0 to An−1, levels of the DQ0 to DQn−1 signals are compared with a level of the internal VREF signal, so that respective logic levels (high level/low level) of the DQ0 to DQn−1 signals are determined. Each output of the input first-stage circuits A0 to An−1 is transmitted to each subsequent-stage circuit (not shown). Although FIG. 2 shows a simplified circuit configuration of the input first-stage circuits A0 to An−1, the circuits A0 to An−1 can actually be configured using more complicated and various circuits.

Herein, as a criterion of determination of the logic level based on the VREF signal, a determination level VIH slightly larger than the level of the VREF signal and a determination level VIL slightly smaller than the level of the VREF signal are defined. The DQ0 to DQn−1 signals need to be larger than the determination level VIH in the case of high level, and need to be smaller than the determination level VIL in the case of low level. For example, a criterion of VIH=VREF+0.2V and VIL=VREF−0.2V is used. Therefore, if noise components of about several hundreds mV is mixed with the VREF signal, the VREF signal deviates from each of determination levels VIH and VIL and the risk of malfunction increases. Accordingly, as measures against this risk, the low-pass filter 10 is provided to eliminate the unnecessary noise components.

The attenuation characteristics of the low-pass filter 10 of the first embodiment will be described below. The low-pass filter as shown in FIG. 2 is a first-order RC low-pass filter, and a cut-off frequency fc=$1/2\pi\tau$ (Hz) is determined based on a time constant $\tau$=R1·C1(s) expressed by the resistance R1 and the capacitance C1. When the VREF signal is input to the low-pass filter 10, in comparison with a border frequency near the cut-off frequency fc, lower frequency components are passed while higher frequency components are attenuated, and the internal VREF signal is output.

In addition, stray capacitance exists on the signal line of the DRAM chip 1, and it is thus necessary to design the above-mentioned capacitance C1 by adding the stray capacitance of the signal line to a capacitance of a capacitor element itself. For example, the stray capacitance of about 1 pF is assumed on the signal line connecting the VREF terminal and the low-pass filter 10.

Further, the low-pass filter 10 can be used also for the purpose of input protection of the VREF terminal. In this case, from the viewpoint of preventing destruction by static electricity or the like, it is required to keep the resistance R1 and the capacitance C1 within an appropriate range.

Figure 3:
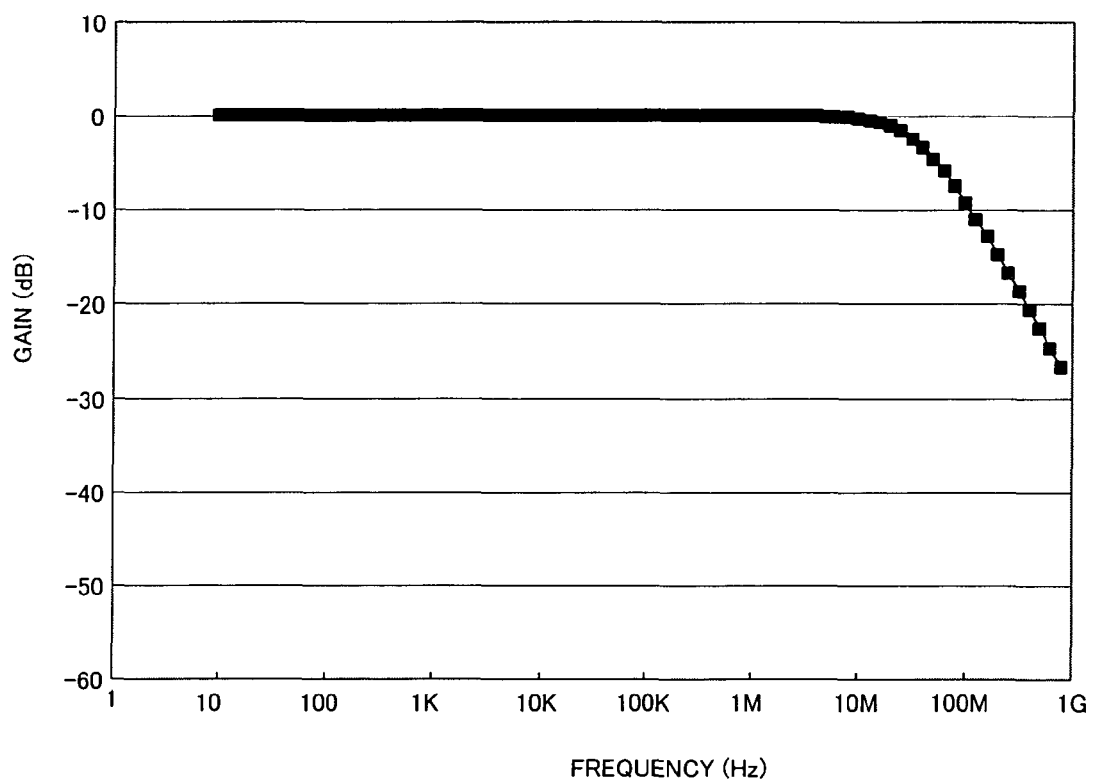
FIG. 3 is a diagram showing a specific example of attenuation characteristics of a low-pass filter of the first embodiment.

FIG. 3 is a diagram showing a specific example of the attenuation characteristics of the low-pass filter 10 of the first embodiment. The attenuation characteristics shown in FIG. 3 are results of simulations performed on a condition that R1=267 Ω and C1=16 pF are set as specific design values of the resistance R1 and the capacitance C1. With the frequency (horizontal axis) of the input signal varied over a wide range, the gain (vertical axis) of the output signal relative to the input signal was calculated for each frequency. As shown in the graph of FIG. 3, the attenuation characteristics are obtained in which the gain is flat in the low-frequency region and is attenuated at a predetermined rate in the high-frequency region. In this case, the cut-off frequency fc is near 37 MHz, however, since the attenuation characteristics have a moderate variation, an increase in attenuation amount becomes remarkable at the order of 100 MHz.

As described above, in the DRAM chip 1 of the first embodiment, the noise component of about several hundreds MHz is a problem, and according to the attenuation characteristics as shown in FIG. 3, it is possible to obtain a sufficient attenuation amount at frequencies greater than or equal to 100 MHz. For example, the gain is about −10 dB at a frequency of 100 MHz, and it is understood that the attenuation amount of about 10 dB is obtained. In the first embodiment, it is desirable to obtain the attenuation amount at least greater than about 6 dB at the frequency of 100 MHz. Although the required attenuation amount varies depending on conditions of the operating clock and the like, it is necessary to obtain a predetermined attenuation amount to adequately suppress the noise component. In addition, since the VREF signal is DC, the attenuation characteristics may be designed to shift to the lower frequency side (the cut-off frequency fc is decreased), but such a design requires a trade-off with the setting of the resistance R1 and the capacitance C1.

Here, the location of the low-pass filter 10 of the first embodiment is suitable for eliminating noise components contained in the VREF signal input from outside through the VREF terminal. Meanwhile, in terms of the input first-stage circuits A0 to An−1 inside the DRAM chip 1, the capacitor C1 is connected between each of the circuits and ground, resulting in an arrangement effective for decoupling of noise. Thus, from the viewpoint of measures against the noise between the input first-stage circuits A0 to An−1, it is desirable to set a large value of the capacitance C1 to some extent.

Meanwhile, since the area occupied in the DRAM chip 1 increases corresponding to the value of the capacitance C1, and the value of the capacitance C1 is limited in terms of a reasonable chip size. Further, regarding a value of the resistance R1, increasing the value results in an increase in complexity of manufacturing resistor elements, and it is necessary to set the value within a suitable range. As described above, it is desirable to determine the resistance R1 and the capacitance C1, considering the attenuation amount of unnecessary noise components of the VREF signal, decoupling between the input first-stage input circuits A0 to An−1, and balance between the chip size, cost and the like.

The low-pass filter 10 of the first embodiment is not limited to the configuration as shown in FIG. 1, and is applicable to various modifications. FIG. 4 shows two modification examples of the low-pass filter 10 of the first embodiment. In a modification as shown in FIG. 4A, a low-pass filter 20 is composed of the resistor R1 connected in series with the signal line and a capacitor C1' connected between the signal line and a power supply voltage VDD.

Figure 4A:
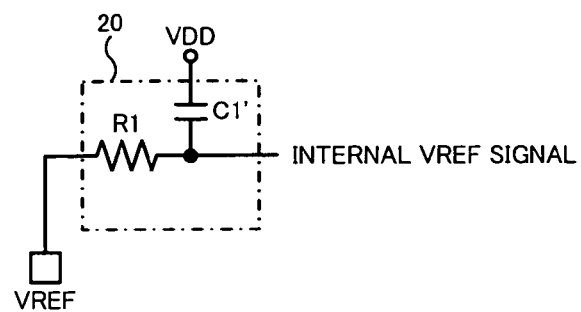
FIG. 4A and 4B show two modification examples of the low-pass filter of the first embodiment.

Regarding the attenuation characteristics of the low-pass filter 20, any difference does not exist between the configuration of FIG. 4A and the configuration of FIG. 2, as long as the values of the resistance R1 and capacitance C1' of FIG. 4A are the same as those of FIG. 2. Meanwhile, in the circuit board of the memory module with the DRAM chip 1 mounted thereon, it is effective to use properly the configuration of FIG. 4A or FIG. 2, as measures against the noise suitable for a wiring layer, through which the VREF signal and a return current of a signal whose level is determined by the VREF signal flow. The configuration of FIG. 2 is suitable for noise elimination when the VREF signal and the return current of the signal whose level is determined by the VREF signal flow through the wiring layer on the ground side of the circuit board. On the other hand, the configuration of FIG. 4A is suitable for noise elimination when the VREF signal and the return current of the signal whose level is determined by the VREF signal flow through the wiring layer on the side of the power supply voltage VDD of the circuit board.

Figure 4B:
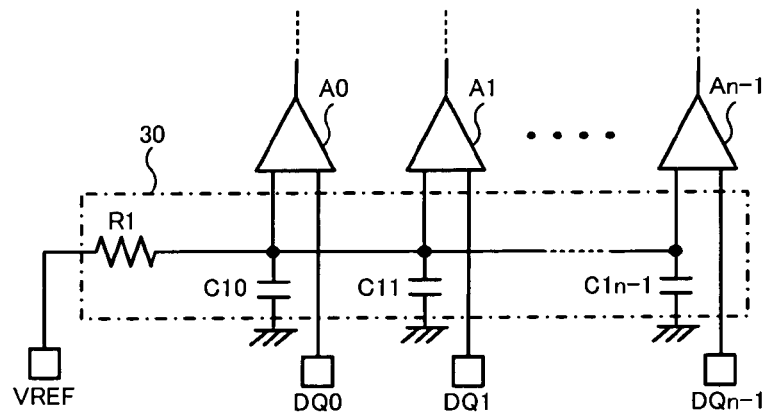

In a modification as shown in FIG. 4B, a low-pass filter 30 is composed of the resistor R1 and n capacitors C10 to C1n−1. The n capacitors C10 to C1n−1 are distributed and arranged in the vicinity of respective input first-stage circuits A0 to An−1. Thus, the cut-off frequency is determined by combined capacitance obtained by adding all the capacitances C10 to C1n−1 and by the resistance R1. Such a configuration in which the capacitors C10 to Cn−1 are thus distributed and arranged is effective to suppress the effect of coupling of the input first-stage circuits A0 to An−1 of the DRAM chip and the like.

Further, without being limited to the above-mentioned modifications, the low-pass filter 10 can be configured employing a well-known configuration as a passive low-pass filter. For example, the number of elements of the low-pass filter 10 may be increased to realize higher-order attenuation characteristics without being limited to the first-order attenuation characteristics. Otherwise, the resistor R1 may be replaced with an inductance to constitute an LC low-pass filter without being limited to the RC low-pass filter.

Figure 5:
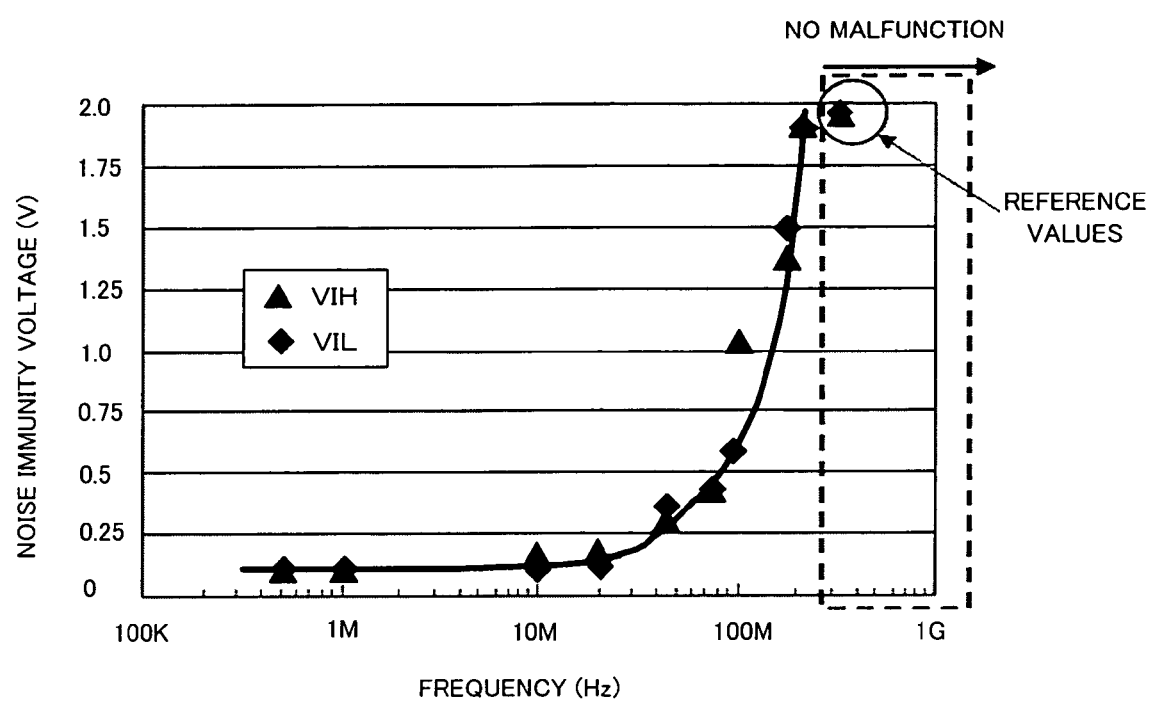
FIG. 5 is a graph for explaining the effect of the low-pass filter of the first embodiment.

FIG. 5 is a diagram for explaining the effect of the low-pass filter 10 of the first embodiment. FIG. 5 shows measurement results of noise immunity voltage when noise is mixed with the VREF signal for the DRAM chip 1 of FIG. 2 in which the low-pass filter 10 is provided. The noise immunity voltage is a voltage representing a degree of immunity to noise, which means that when noise of a specific frequency is mixed with the VREF signal, the noise of a voltage smaller than the noise immunity voltage does not cause malfunction in the logic determination of a receiver circuit. In FIG. 5, maximum noise voltages which do not cause malfunction of the determination levels VIH and VIL when sinusoidal noise with frequencies ranging from 100 kHz to 1 GHz is mixed. As shown by the trend line in FIG. 5, the malfunction does not occur at frequencies near 100 MHz even when noise of about 600 mV is added, and further, the malfunction does not occur at frequencies near 200 MHz even when noise of about 2 V is added. As shown as reference values, the malfunction does not occur in a higher-frequency region even when the maximum noise is mixed. The results of FIG. 5 are based on the effect of sufficiently attenuating the high-frequency noise components by the low-pass filter 10.

Second Embodiment

Figure 6:
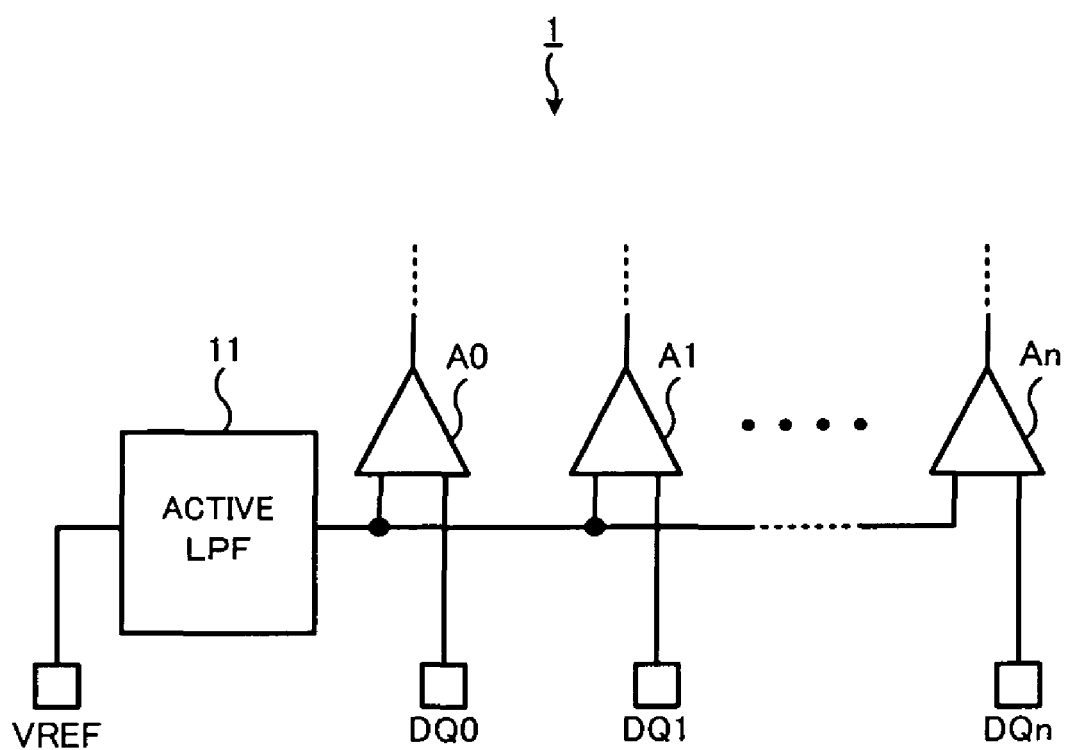
FIG. 6 is a diagram showing a principal configuration of a DRAM chip as a semiconductor memory device of a second embodiment.

In the second embodiment, the present invention is applied to a DRAM chip in which the configuration of the low-pass filter 10 of the above-mentioned first embodiment is modified. FIG. 6 is a diagram showing a principal configuration of the DRAM chip 1 as a semiconductor memory device of the second embodiment. The entire configuration including the memory module of the second embodiment is the same as in FIG. 1.

As shown in FIG. 6, the DRAM chip 1 of the second embodiment has an active low-pass filter 11 inserted between the VREF terminal and input first-stage circuits A0 to An−1. The active low-pass filter 11 has a circuit configuration including active elements such as MOS transistors, and as in the low-pass filter 10 of the first embodiment, has the function of passing a DC component of the VREF signal and eliminating unnecessary high-frequency components. In FIG. 6, the VREF signal, the DQ0 to DQn−1 terminals and the input first-stage circuits A0 to An−1 have the same configuration as those in the first embodiment.

Figure 7:
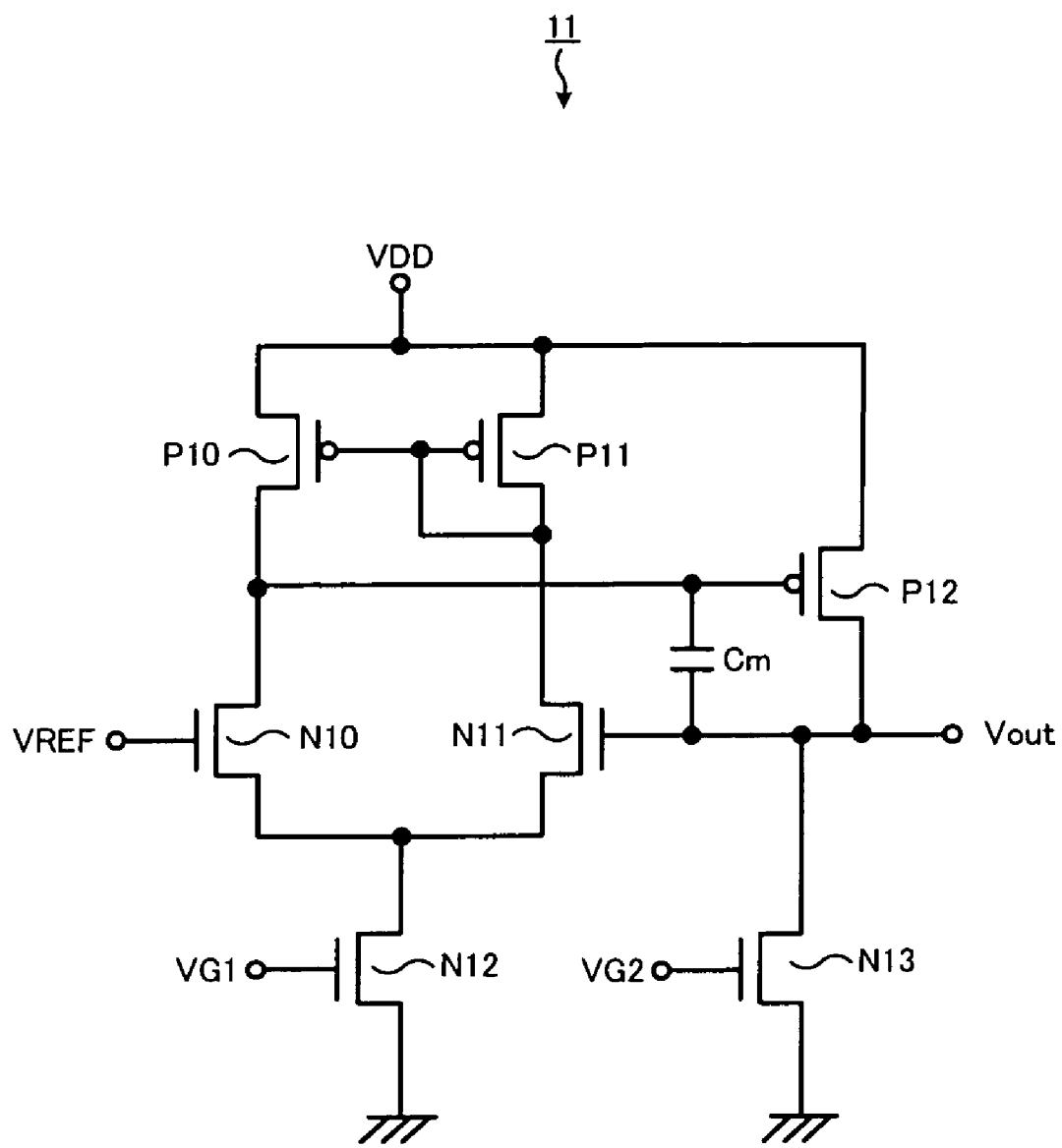
FIG. 7 is a diagram showing a specific example of a circuit configuration of an active low-pass filter of the second embodiment.

FIG. 7 is a diagram showing a specific example of the circuit configuration of the active low-pass filter 11 of the second embodiment. As shown in FIG. 7, the active low-pass filter 11 of the second embodiment is composed of three PMOS transistors P10, P11 and P12, four NMOS transistors N10, N11, N12 and N13, and a mirror capacitor Cm. The active low-pass filter 11 of the second embodiment functions as a regulator circuit for generating an output signal Vout having the same level as the VREF signal, to which the power supply voltage VDD is supplied.

In the regulator circuit as shown in FIG. 7, symmetrically arranged PMOS transistors P10, P11 and NMOS transistors N10, N11 constitute a differential amplifier circuit, and current flowing from the power supply voltage VDD to the differential amplifier circuit is controlled by a gate voltage VG1 applied to the NMOS transistor N12. The VREF signal is applied to the gate of the NMOS transistor N10, and at the gate of the paired NMOS transistor N11, an output signal Vout following the VREF signal is generated. On the output side, the PMOS transistor 12 and the NMOS transistor 13 form a series circuit, and current flowing from the power supply voltage VDD to the series circuit is controlled by a gate voltage VG2 applied to the NMOS transistor 13. The output signal Vout is connected to an intermediate node of the series circuit of the output stage, and is controlled so as to approximately conform to half the DC voltage of the power supply voltage VDD.

A characteristic configuration of the second embodiment is that the mirror capacitor Cm is connected between the gate and the drain of the PMOS transistor P12. The mirror capacitor Cm has a function of attenuating high-frequency components contained in the VREF signal input to the regulator circuit. The attenuation characteristics of this case can be adjusted corresponding to a value of the mirror capacitance Cm and operation characteristics such as a gain or a current value of the regulator circuit of FIG. 7. Here, the mirror capacitor Cm has a high capacitance value seen from the input side corresponding to the gain of the regulator circuit, and thus it is possible to obtain an equal attenuation characteristics using the mirror capacitance Cm lower than the capacitance C1 of FIG. 1.

In FIG. 7, as well as the mirror capacitor Cm, a predetermined capacitance can be connected between the signal line of the output signal Vout and ground. By connecting such a capacitance, it is possible to further improve the effect of eliminating the noise components in a combination with the mirror capacitor Cm.

The configuration of the regulator circuit of FIG. 7 is effective in taking measures against noise from the inside to outside in the DRAM chip 1, as well as in attenuating the noise components contained in the VREF signal. In other words, the circuit configuration as shown in FIG. 7 functions as the active low-pass filter 11 in the transmission direction of the VREF signal from the input side to the output side, but the reverse direction is not a transmission path of a signal (from the output side to the input side). Thus, even when noise generated inside the DRAM chip 1 is mixed with the internal VREF signal, it is possible to maintain high isolation from outside and to reliably block the noise.

Further, in the regulator circuit of FIG. 7, it is possible to decrease the impedance of the signal line of the internal VREF signal by passing sufficient current through the series circuit of the output stage. Thus, when the problem arises with noise transmitted between the input first-stage circuits A0 to An−1 of the DRAM chip 1, it is possible to suppress mutual influences of the noise.

Figure 8:
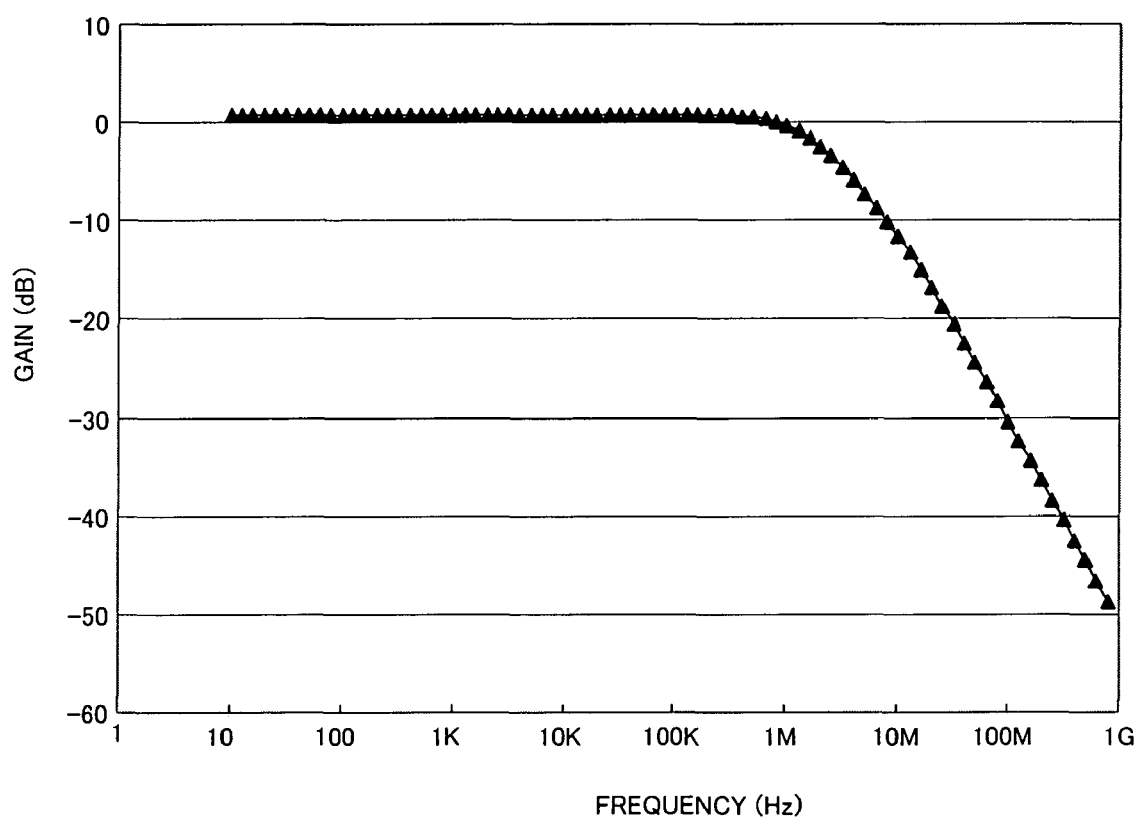
FIG. 8 is a graph showing a specific example of attenuation characteristics of the active low-pass filter of the second embodiment.

FIG. 8 is a graph showing a specific example of the attenuation characteristics of the active low-pass filter 11 of the second embodiment. The attenuation characteristics shown in FIG. 8 are results of simulations performed on a design condition that the current of the NMOS transistor N12 is 100 μA, the current of the NMOS transistor N13 is 1 μA, the mirror capacitance Cm is 0.5 pF, and the capacitance between the signal line of the output signal Vout and ground is 16 pF. Conditions for calculating the frequency (horizontal axis) and the gain (vertical axis) in FIG. 8 are the same as in FIG. 3, and the trend of the graph is almost the same as in FIG. 3. However, the cut-off frequency is lower in the design condition of FIG. 8 than that in FIG. 3, and the attenuation thereby begins in a slightly lower frequency range.

In the foregoing, the present invention is described based on the first and second embodiments, but is not limited to the above-mentioned embodiments, and is capable of being modified in various manners without departing from the scope of the subject matter. For example, in the first and second embodiments, the examples in which the DRAM chip 1 is provided with a single VREF terminal are described, but the DRAM chip 1 may be provided with a plurality of VREF terminals for different applications. For example, a VREF terminal to which a VREF signal for a DQ signal is input may be provided, and another VREF terminal to which a VREF signal for an address signal is input may also be provided. In this case, the DRAM chip 1 has two sets of configuration of FIG. 2, FIG. 4 or FIG. 6, one of which is for DQ and the other of which is for the address, for example. Further, application of the invention is not limited to the semiconductor memory device, and the invention is readily applied to various semiconductor devices to which a VREF signal is input from outside.

Further, regarding the memory module described in the above-mentioned embodiments, the examples are shown in which the VREF signal is input from an external terminal, however it is possible to configure so that the VREF signal is generated inside the memory module by implementing the VREF voltage generator 4 in the memory module or dividing an external voltage applied to the memory module. The present invention is capable of achieving the same effect as in the case of thus generating the VREF signal inside the memory module.

The present invention is not limited to the above described embodiments, and various variations and modifications may be possible without departing from the scope of the present invention.

This application is based on the Japanese Patent application No. 2005-300803 filed on Oct. 14, 2005, entire content of which is expressly incorporated by reference herein.

What is claimed is:

1. A semiconductor device comprising, on a single semiconductor chip:
   a plurality of DQ terminals each receiving a DQ signal supplied from outside of the semiconductor device;
   a plurality of input circuits each including a first input node coupled to a corresponding one of the DQ terminals to receive the DQ signal and a second input node supplied with a reference voltage, and comparing the DQ signal with the reference voltage to produce an output signal at an output node thereof;
   a second terminal receiving a DC voltage supplied from the outside of the semiconductor device; and
   a low-pass filter coupled at one end thereof to the second terminal and at the other end thereof in common to the second input nodes of the input circuits, the low-pass filter transmitting the DC voltage from the second terminal to each of the second input nodes of the input circuits as the reference voltage and attenuating a noise signal which may be supplied to the second terminals together with the DC voltage from the outside of the semiconductor device so that a difference between the reference voltage and the DC voltage caused by the noise signal is suppressed.

2. The semiconductor device as claimed in claim 1, wherein the device is supplied with a power supply voltage, the DC voltage takes a half voltage of the power supply voltage.

3. The semiconductor device as claimed in claim 1, wherein an attenuation amount of the low-pass filter is greater than approximately 6 dB at a frequency of 100 MHz.

4. The semiconductor device as claimed in claim 1, wherein the low-pass filter includes a plurality of capacitors, and each of the capacitors is arranged in a vicinity of a corresponding one of the second input nodes of the input circuits.

5. The device as claimed in claim 1, further comprising a power supply node supplying the low-pass filter with a power supply voltage, and wherein the low-pass filter includes a transistor coupled between an output node thereof and the power supply node, a differential amplifier circuit including a second output node coupled to a control electrode of the transistor, and a mirror capacitor coupled between the second output node of the differential amplifier and the output node of the low-pass filter.

6. A memory module comprising:
   a circuit board;
   a wiring layer formed on the circuit board to convey a DC voltage; and
   a plurality of semiconductor devices mounted on the circuit board, each of the semiconductor devices comprising, on a single semiconductor chip;
   a plurality of DQ terminals each receiving a DQ signal supplied from outside of the single semiconductor device,
   a plurality of input circuits each including a first input node coupled to a corresponding one of the DQ terminals to receive the DQ signal and a second input node supplied with a reference voltage, and comparing the DQ signal with the reference voltage to produce an output signal at an output node thereof,
   a second terminal, and
   a low-pass filter coupled at one end thereof to the second terminal and at the other end thereof in common to the second input nodes of the input circuits;
   the second terminals of the semiconductor devices being connected in common to the wiring layer to receive the DC voltage,
   each of the low-pass filters of the semiconductor devices transmitting the DC voltage from the second terminal of an associated one of the semiconductor devices to the second input nodes of the input circuits of the associated one of the semiconductor devices as the reference voltage and attenuating a noise signal which may be supplied to the second terminals together with the DC voltage from outside of the associated one of the semiconductor devices so that a difference between the reference voltage and the DC voltage caused by the noise signal is suppressed.

7. The memory module as claimed in claim 6, wherein each of the semiconductor devices is supplied with a power supply voltage, and each of the DC voltage takes a half voltage of the power supply voltage supplied to an associated one of the semiconductor devices.

8. The memory module as claimed in claim 6, wherein an attenuation amount of each of low-pass filters of the semiconductor devices is greater than approximately 6 dB at a frequency of 100 MHz.

9. The memory module as claimed in claim 6, wherein each of plurality of the low-pass filters of the semiconductor devices includes a plurality of capacitors, and each of the capacitors is arranged in a vicinity of a corresponding one of the second input nodes of the input circuits of an associated one of the semiconductor device.

10. The memory module as claimed in claim 6, wherein each of the semiconductor devices further comprises a power supply node supplying the low-pass filter thereof with a power supply voltage, each the of the of low-pass filters of the semiconductor devices includes a transistor coupled between an output node thereof and the power supply node of an associated one of the semiconductor devices, a differential amplifier circuit including a second output node coupled to a control electrode of the transistor, and a mirror capacitor coupled between the second output node of the differential amplifier and the output node thereof.

11. A system comprising:
a generator generating a DC voltage; and
a memory module comprising;
a circuit board;
a wiring layer formed on the circuit board to convey the DC voltage; and
a plurality of semiconductor devices mounted on the circuit board, each of the semiconductor devices comprising, on a single semiconductor chip;
a plurality of DQ terminals each receiving a DQ signal supplied from outside of the single semiconductor device,
a plurality of input circuits each including a first input node coupled to a corresponding one of the DQ terminals to receive the DQ signal and a second input node supplied with a reference voltage, and comparing the DQ signal with the reference voltage to produce an output signal at an output node thereof,
a second terminal, and
a low-pass filter coupled at one end thereof to the second terminal and at the other end thereof in common to the second input nodes of the input circuits;
the second terminals of the semiconductor devices being connected in common to the wiring layer to receive the DC voltage,
each of the low-pass filters of the semiconductor devices transmitting the DC voltage from the second terminal of an associated one of the semiconductor devices to the second input nodes of the input circuits of the associated one of the semiconductor devices as the reference voltage and attenuating a noise signal which may be supplied to the second terminals together with the DC voltage from outside of the associated one of the semiconductor devices so that a difference between the reference voltage and the DC voltage caused by the noise signal is suppressed.

12. The system as claimed in claim 11, wherein each of the semiconductor devices is supplied with a power supply voltage, and each of the DC voltage takes a half voltage of the power supply voltage supplied to an associated one of the semiconductor devices.

13. The system as claimed in claim 11, wherein an attenuation amount of each of the low-pass filters of the semiconductor devices is greater than approximately 6 dB at a frequency of 100 MHz.

14. The system as claimed in claim 11, wherein each of the low-pass filters of the semiconductor devices includes a plurality of capacitors, and each of the capacitors is arranged in a vicinity of a corresponding one of the second input nodes of the input circuits of an associated one of the semiconductor device.

15. The system as claimed in claim 11, wherein each of the semiconductor devices further comprises a power supply node supplying the low-pass filter thereof with a power supply voltage, each of the low-pass filters of the semiconductor devices includes a transistor coupled between an output node thereof and the power supply node of an associated one of the semiconductor devices, a differential amplifier circuit including a second output node coupled to a control electrode of the transistor, and a mirror capacitor coupled between the second output node of the differential amplifier and the output node thereof.

* * * * *